(12) United States Patent
Ho et al.

(10) Patent No.: US 8,367,937 B2
(45) Date of Patent: Feb. 5, 2013

(54) PRINTED CIRCUIT BOARD WITH A SIGNAL LINE PAIR AND METHOD OF MANUFACTURING THE SAME

(75) Inventors: Voonyee Ho, Ibaraki (JP); Takeshi Tanaka, Ibaraki (JP); Masami Inoue, Ibaraki (JP); Martin John McCaslin, Fremont, CA (US)

(73) Assignee: Nitto Denko Corporation, Osaka (JP)

( * ) Notice: Subject to any disclaimer, the term of this patent is extended or adjusted under 35 U.S.C. 154(b) by 503 days.

(21) Appl. No.: 12/549,993

(22) Filed: Aug. 28, 2009

(65) Prior Publication Data

US 2010/0051334 A1 Mar. 4, 2010

(30) Foreign Application Priority Data

Sep. 3, 2008 (JP) ................................. 2008-226393

(51) Int. Cl.
*H05K 1/09* (2006.01)
(52) U.S. Cl. ........................................................ 174/257
(58) Field of Classification Search .................. 174/257, 174/250, 253, 255, 258, 261; 361/728, 748–751, 361/777, 778
See application file for complete search history.

(56) References Cited

U.S. PATENT DOCUMENTS

| 6,480,359 | B1 | 11/2002 | Dunn et al. |
| 6,608,736 | B1 | 8/2003 | Klaassen et al. |
| 2003/0053258 | A1 | 3/2003 | Dunn et al. |
| 2004/0070884 | A1 | 4/2004 | Someya et al. |

FOREIGN PATENT DOCUMENTS

| JP | 01179501 A | 7/1989 |
| JP | 2000173035 A | 6/2000 |
| JP | 2003218480 A | 7/2003 |
| JP | 2004023000 A | 1/2004 |
| JP | 2004501511 A | 1/2004 |
| JP | 2004-133988 A | 4/2004 |
| JP | 2004192681 A | 7/2004 |
| JP | 2004201000 A | 7/2004 |
| JP | 2004207949 A | 7/2004 |
| JP | 2007273896 A | 10/2007 |
| WO | 0186641 A1 | 11/2001 |

OTHER PUBLICATIONS

Office Action issued Feb. 21, 2012 in CN Application No. 2008-226393.
Office Action issued Dec. 23, 2011 in CN Application No. 200910167295.0.
Office Action issued Oct. 8, 2012 in CN Application No. 200910167295.0.

*Primary Examiner* — Jeremy Norris
*Assistant Examiner* — Tremesha S Willis
(74) *Attorney, Agent, or Firm* — Panitch Schwarze Belisario & Nadel LLP

(57) ABSTRACT

A first insulating layer is formed on a suspension body. A write wiring trace is formed on the first insulating layer. A second insulating layer is formed on the first insulating layer to cover the write wiring trace. A write wiring trace and read wiring traces are formed on the second insulating layer. The write wiring trace is arranged above the write wiring trace. The write wiring trace includes a conductor layer and reinforcing alloy layers. The reinforcing alloy layers are sequentially formed to cover an upper surface and side surfaces of the conductor layer.

9 Claims, 10 Drawing Sheets

PRINTED CIRCUIT BOARD WITH A SIGNAL LINE PAIR AND METHOD OF MANUFACTURING THE SAME

BACKGROUND OF THE INVENTION

1. Field of the Invention

The present invention relates to a printed circuit board and a method of manufacturing the same.

2. Description of the Background Art

Actuators are employed in drives such as hard disk drives. Such an actuator includes an arm arranged rotatably with respect to a rotation shaft and a suspension board used for a magnetic head that is attached to the arm. The suspension board is a printed circuit board for positioning the magnetic head with a desired track of a magnetic disk.

FIG. 10 is a vertical sectional view of a conventional suspension board shown in JP 2004-133988 A, for example.

In the suspension board 910, a first insulating layer 904 is formed on a metal substrate 902. A write wiring trace W2 and a read wiring trace R2 are formed to be spaced apart from each other by a distance L1 on the first insulating layer 904.

A second insulating layer 905 is formed on the first insulating layer 904 to cover the write wiring trace W2 and the read wiring trace R2. On the second insulating layer 905, a write wiring trace W1 is formed at a position above the read wiring trace R2, and a read wiring trace R1 is formed at a position above the write wiring trace W2.

The distance between the read wiring trace R1 and the write wiring trace W2 that are positioned one above the other and the distance between the read wiring trace R2 and the write wiring trace W1 that are positioned one above the other are L2, respectively.

In the suspension board 910 having the foregoing configuration, the distances between the write wiring traces W1, W2 and the read wiring trace R1 are substantially equal to the distances between the write wiring traces W1, W2 and the read wiring trace R2, respectively. Accordingly, it is considered that the magnitude of induced electromotive forces generated in the read wiring traces R1, R2 are substantially equal when write currents pass through the write wiring traces W1, W2. This allows a crosstalk between the write wiring traces W1, W2 and the read wiring traces R1, R2 to be reduced.

Recently, it is desired to reduce transmission loss of the write wiring traces for the purpose of lower power consumption of electronic equipment. Moreover, the write wiring traces and the read wiring traces with higher strength are desired in order to prevent the write wiring traces and the read wiring traces from being damaged at the time of being bent.

SUMMARY OF THE INVENTION

An object of the present invention is to provide a printed circuit board whose transmission characteristics are well maintained and strength is improved and a method of manufacturing the same.

(1) According to an aspect of the present invention, a printed circuit board includes a first insulating layer, a first wiring layer that is formed on the first insulating layer, a second insulating layer that is formed on the first insulating layer to cover the first wiring layer, a second wiring layer that is formed on the second insulating layer to be positioned above the first wiring layer and constitutes with the first wiring layer a signal line pair, and a conductive first reinforcing layer that is formed on at least an upper surface of the second wiring layer and not formed on an upper surface of the first wiring layer and a lower surface of the second wiring layer, wherein a width of the first wiring layer is larger than a thickness of the first wiring layer, and a width of the second wiring layer is larger than a thickness of the second wiring layer.

In the printed circuit board, the second wiring layer is arranged above the first wiring layer. Therefore, when currents pass through the first and second wiring layers in opposite directions to each other, the currents are concentrated along the upper surface of the first wiring layer and the lower surface of the second wiring layer due to the proximity effect.

In this case, the width of the first wiring layer is larger than the thickness of the first wiring layer, and the width of the second wiring layer is larger than the thickness of the second wiring layer, so that transmission loss in the first and second wiring layers is reduced as compared with a case where the first and second wiring layers are arranged in a common plane. This improves the transmission characteristics of the first and second wiring layers.

In addition, the conductive first reinforcing layer is formed on at least the upper surface of the second wiring layer and not formed on the upper surface of the first wiring layer and the lower surface of the second wiring layer. In this case, even though an external stress is applied to the second wiring layer that is arranged above, reinforcing the second wiring layer with the conductive first reinforcing layer prevents the second wiring layer from being damaged while conductivity is ensured.

Since the first reinforcing layer is not formed on the upper surface of the first wiring layer and the lower surface of the second wiring layer, the current would not be caused to intensively pass through the first reinforcing layer due to the proximity effect. Therefore, the first reinforcing layer would not cause the transmission loss even in the case of having high resistivity.

As a result, the second wiring layer can be prevented from being damaged while the transmission characteristics of the first and second wiring layers can be well maintained.

(2) The first reinforcing layer may have higher rigidity and higher resistivity than rigidity and resistivity of the second wiring layer.

In this case, the conductive first reinforcing layer is formed on at least the upper surface of the second wiring layer, thereby sufficiently preventing the second wiring layer from being damaged.

Moreover, the first reinforcing layer having high resistivity is not formed on the upper surface of the first wiring layer and the lower surface of the second wiring layer, thus not causing the transmission loss.

(3) The first and second wiring layers may include copper, and the first reinforcing layer may include an alloy of copper and tin. In this case, the first and second wiring layers include copper, so that the conductivity of the first and second wiring layers is sufficiently ensured. In addition, the first reinforcing layer includes the alloy of copper and tin, so that the rigidity of the first reinforcing layer is sufficiently ensured.

(4) The printed circuit board may further include third and fourth wiring layers that are formed at a distance on the first insulating layer or the second insulating layer and constitute a signal line pair.

In this case, when the printed circuit board is used as a suspension board of a drive such as a hard disk drive, the first and second wiring layers can be used for writing information in a magnetic disk, and the third and fourth wiring layers can be used for reading information from the magnetic disk.

In addition, the third and fourth wiring layers are arranged in a common plane, so that the third and fourth wiring layers have higher impedance than in a case where the third and fourth wiring layers are arranged one above the other. Thus, the third and fourth wiring layers can read information well from the magnetic disk.

(5) The printed circuit board may further include a conductive second reinforcing layer that is formed on at least one surface of the third wiring layer, and a conductive third reinforcing layer that is formed on at least one surface of the fourth wiring layer.

In this case, the third wiring layer is reinforced by the conductive second reinforcing layer, and the fourth wiring layer is reinforced by the conductive third reinforcing layer. Thus, the third and fourth wiring layers are prevented from being damaged while the conductivity is ensured.

(6) The second and third reinforcing layers may have higher rigidity than rigidity of the third and fourth wiring layers. In this case, the third and fourth wiring layers can be sufficiently prevented from being damaged.

(7) The distance between the third and fourth wiring layers may be not less than 10 μm and not more than 100 μm.

In this case, the distance between the third and fourth wiring layers is not less than 10 μm to suppress larger transmission loss due to the proximity effect. Furthermore, the distance of not more than 100 μm between the third and fourth wiring layers avoids a larger space for arranging the third and fourth wiring layers.

(8) The printed circuit board may further include a long-sized metal substrate, and a head provided on the metal substrate for reading and writing signals, wherein the first insulating layer may be formed on the metal substrate, the first, second, third and fourth wiring layers may be electrically connected to the head, and currents may pass through the first and second wiring layers at the time of writing the signals by the head, and currents may pass through the third and fourth wiring layers at the time of reading the signals by the head.

In this case, the printed circuit board can be used as a suspension board of a drive such as a hard disk drive. Then, the first and second wiring layers can write information in a magnetic disk and the third and fourth wiring layers can read information from the magnetic disk.

(9) According to another aspect of the present invention, a method of manufacturing a printed circuit board includes the steps of forming a first wiring layer on a first insulating layer, forming a second insulating layer on the first insulating layer to cover the first wiring layer, forming a second wiring layer, which constitutes with the first wiring layer a signal line pair, on the second insulating layer to be positioned above the first wiring layer, and forming a conductive first reinforcing layer on at least an upper surface of the second wiring layer and not forming the conductive first reinforcing layer on an upper surface of the first wiring layer and a lower surface of the second wiring layer, wherein a width of the first wiring layer is larger than a thickness of the first wiring layer, and a width of the second wiring layer is larger than a thickness of the second wiring layer.

In the manufacturing method, the second wiring layer is formed above the first wiring layer. Therefore, when currents pass through the first and second wiring layers in opposite directions to each other, the currents are concentrated along the upper surface of the first wiring layer and the lower surface of the second wiring layer due to the proximity effect.

In this case, the width of the first wiring layer is larger than the thickness of the first wiring layer, and the width of the second wiring layer is larger than the thickness of the second wiring layer, so that transmission loss in the first and second wiring layers is reduced as compared with a case where the first and second wiring layers are arranged in a common plane. This improves the transmission characteristics of the first and second wiring layers.

In addition, the conductive first reinforcing layer is formed on at least the upper surface of the second wiring layer and not formed on the upper surface of the first wiring layer and the lower surface of the second wiring layer. In this case, even though an external stress is applied to the second wiring layer that is arranged above, reinforcing the second wiring layer with the conductive first reinforcing layer prevents the second wiring layer from being damaged while conductivity is ensured.

Since the first reinforcing layer is not formed on the upper surface of the first wiring layer and the lower surface of the second wiring layer, the current would not be caused to intensively pass through the first reinforcing layer due to the proximity effect. Therefore, the first reinforcing layer would not cause the transmission loss even in the case of having high resistivity.

As a result, the second wiring layer can be prevented from being damaged while the transmission characteristics of the first and second wiring layers of the printed circuit board can be well maintained.

According to the present invention, the first and second wiring layers are arranged one above the other to reduce the transmission loss in the first and second wiring layers. In addition, the second wiring layer is reinforced by the first reinforcing layer without causing the transmission loss. Accordingly, the transmission characteristics of the first and second wiring layers can be well maintained and the second wiring layer can be prevented from being damaged.

Other features, elements, characteristics, and advantages of the present invention will become more apparent from the following description of preferred embodiments of the present invention with reference to the attached drawings.

DESCRIPTION OF THE PREFERRED EMBODIMENTS

Figure 1:
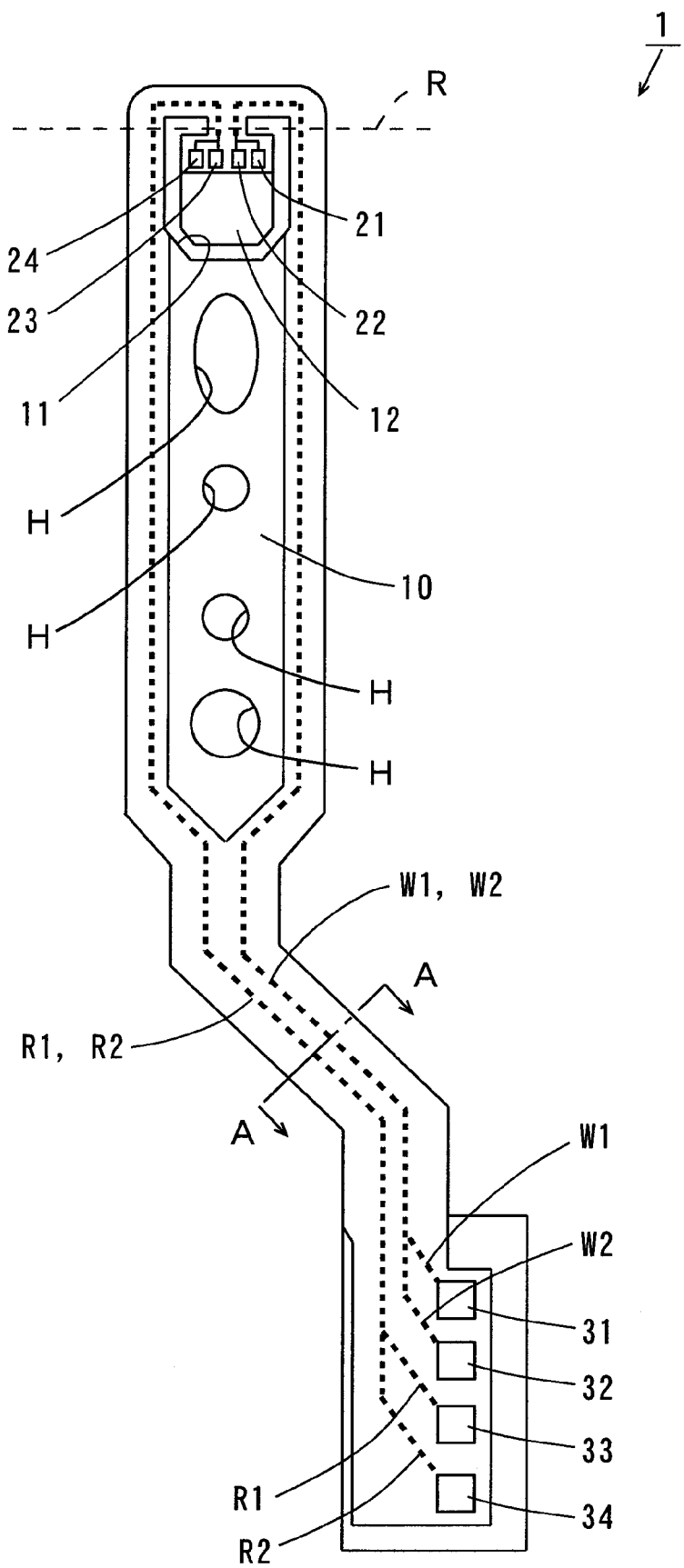
FIG. 1 is a top view of a suspension board according to the present embodiment.

Description will be made of a printed circuit board and a method of manufacturing the same according to embodiments of the present invention while referring to the drawings. Hereinafter, description is made of the configuration of a suspension board used in an actuator of a hard disk drive as the printed circuit board according to the embodiments of the present invention and the method of manufacturing the same.

(1) Configuration of the Suspension Board

FIG. 1 is a top view of the suspension board according to the present embodiment. As shown in FIG. 1, the suspension board 1 includes a suspension body 10 formed of a long-sized metal substrate. Write wiring traces W1, W2 and read wiring traces R1, R2 are formed on the suspension body 10, as indicated by the bold dotted lines. The write wiring traces W1, W2 and the read wiring traces R1, R2 form respective signal line pairs.

At an end of the suspension body 10, a U-shaped opening 11 is formed, thereby providing a magnetic head supporting portion (hereinafter referred to as a tongue) 12. The tongue 12 is bent along the broken line R to form a predetermined angle with respect to the suspension body 10. Four electrode pads 21, 22, 23, 24 are formed at an end of the tongue 12.

Four electrode pads 31, 32, 33, 34 are formed at the other end of the suspension body 10. The electrode pads 21 to 24 on the tongue 12 and the electrode pads 31 to 34 at the other end of the suspension body 10 are electrically connected to one another through the write wiring traces W1, W2 and the read wiring traces R1, R2, respectively. A plurality of holes H are formed in the suspension body 10.

In the hard disk drive (not shown) including the suspension board 1, currents pass through the pair of write wiring traces W1, W2 at the time of writing information in a magnetic disk. Currents pass through the pair of read wiring traces R1, R2 at the time of reading information from the magnetic disk.

Figure 2:
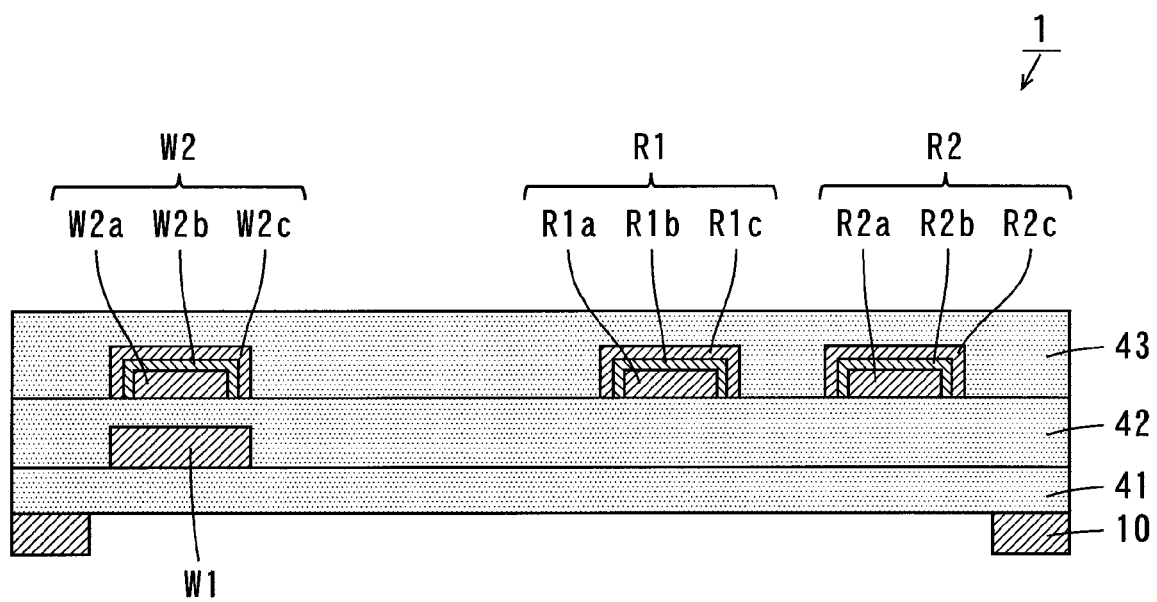
FIG. 2 is a vertical sectional view taken along the line A-A of the suspension board of FIG. 1.

Next, detail description is made of the write wiring traces W1, W2 and the read wiring traces R1, R2 of the suspension board 1. FIG. 2 is a vertical sectional view taken along the line A-A of the suspension board 1 of FIG. 1.

As shown in FIG. 2, a first insulating layer 41 is formed on the suspension body 10 having an opening at its center. The suspension body 10 is formed to extend along peripheral portions of the first insulating layer 41. The write wiring trace W1 is formed on the first insulating layer 41. A second insulating layer 42 is formed on the first insulating layer 41 to cover the write wiring trace W1.

The write wiring trace W2 and the read wiring traces R1, R2 are formed on the second insulating layer 42. The write wiring trace W2 is arranged above the write wiring trace W1, and extends in parallel with the write wiring trace W1. The read wiring traces R1, R2 extend in parallel at a distance from each other.

The write wiring trace W2 includes a conductor layer W2a and reinforcing alloy layers W2b, W2c. The reinforcing alloy layers W2b, W2c are sequentially formed to cover an upper surface and side surfaces of the conductor layer W2a.

The read wiring trace R1 includes a conductor layer R1a and reinforcing alloy layers R1b, R1c, and the read wiring trace R2 includes a conductor layer R2a and reinforcing alloy layers R2b, R2c. The reinforcing alloy layers R1b, R1c are sequentially formed to cover an upper surface and side surfaces of the conductor layer R1a, and the reinforcing alloy layers R2b, R2c are sequentially formed to cover an upper surface and side surfaces of the conductor layer R2a.

The reinforcing alloy layers W2b, W2c, R1b, R1c, R2b, R2c are made of a material having higher rigidity and higher resistivity than those of the conductor layers W2a, R1a, R2a. For example, the conductor layers W2a, R1a, R2a are made of copper, and the reinforcing alloy layers W2b, W2c, R1b, R1c, R2b, R2c are made of an alloy including copper and tin.

A third insulating layer 43 is formed on the second insulating layer 42 to cover the write wiring trace W2 and the read wiring traces R1, R2.

(2) The Method of Manufacturing the Suspension Board

The method of manufacturing the suspension board 1 will be described. Here, description of respective steps of forming the tongue 12, the electrode pads 21 to 24, 31 to 34 and the holes H of FIG. 1 is omitted.

Figure 3:
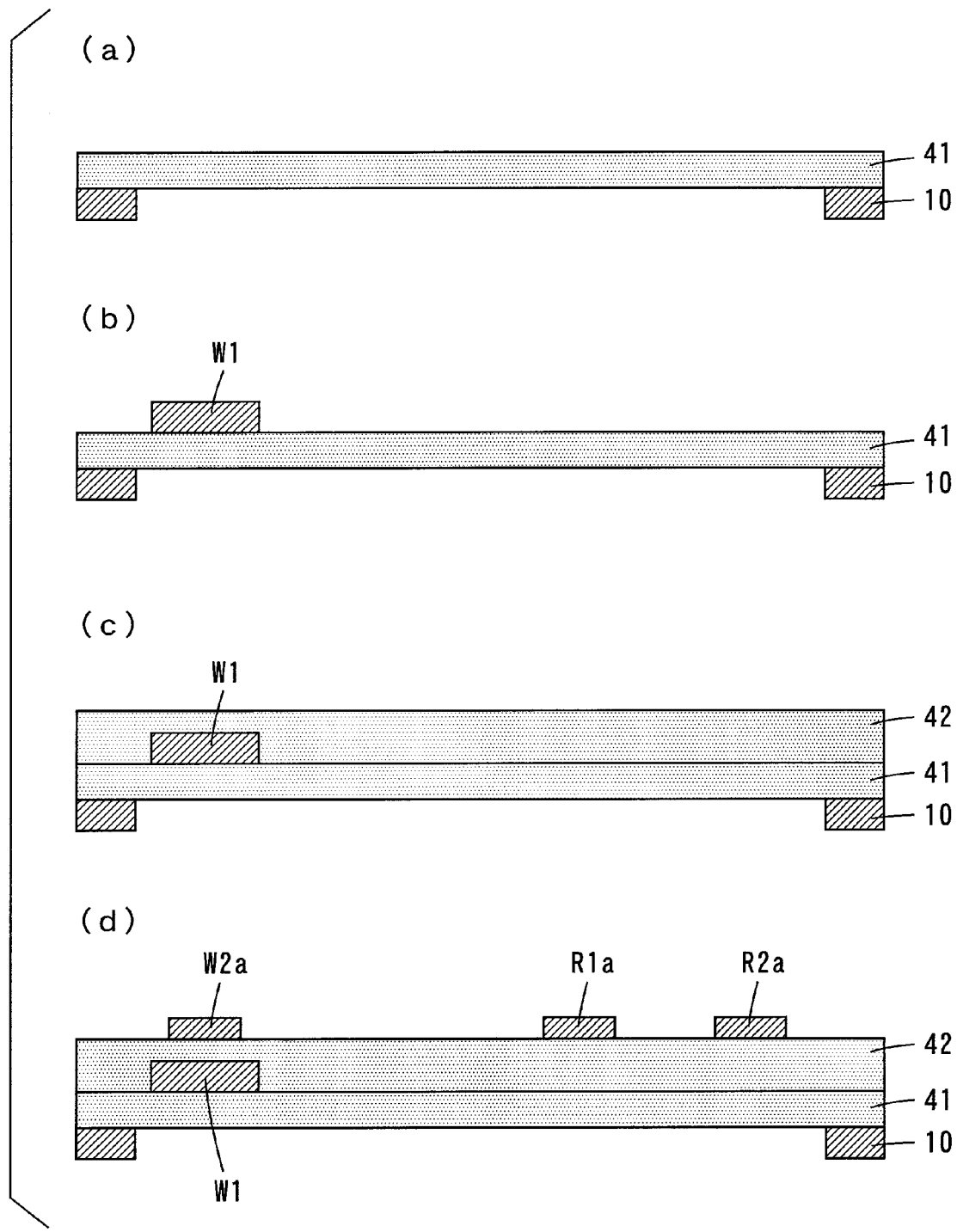
FIG. 3 is a vertical sectional view showing steps of manufacturing the suspension board.
Figure 4:
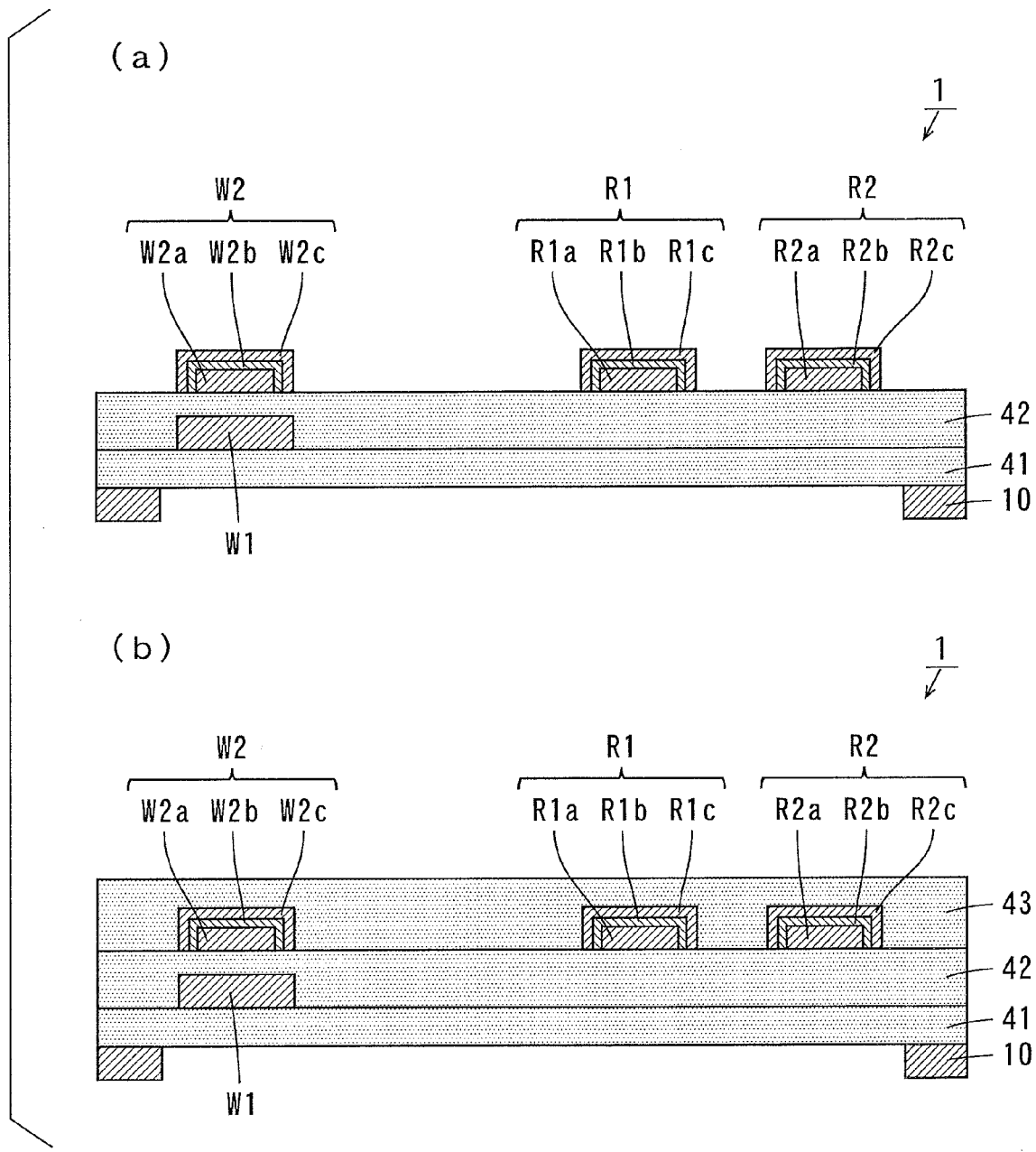
FIG. 4 is a vertical sectional view showing steps of manufacturing the suspension board.

FIGS. 3 and 4 are vertical sectional views showing steps of manufacturing the suspension board 1.

First, the first insulating layer 41 made of polyimide, for example, is laminated on the suspension body 10 made of stainless steel, for example, using an adhesive as shown in FIG. 3(a).

The thickness of the suspension body 10 is not less than 5 μm and not more than 50 μm, for example, and preferably not less than 10 μm and not more than 30 μm. Instead of stainless steel, another metal such as aluminum, another alloy or the like may be used as the suspension body 10.

The thickness of the first insulating layer 41 is not less than 1 μm and not more than 15 μm, for example, and preferably not less than 2 μm and not more than 5 μm. Another insulating material such as epoxy resin instead of polyimide may be used as the first insulating layer 41.

Next, the write wiring trace W1 made of copper, for example, is formed on the first insulating layer 41 as shown in FIG. 3(b). The write wiring trace W1 may be formed using a semi-additive method, for example, or another method such as a subtractive method.

The thickness of the write wiring trace W1 is not less than 3 μm and not more than 16 μm, for example, and preferably not less than 6 μm and not more than 13 μm. The width of the write wiring trace W1 is not less than 10 μm and not more than 500 μm, for example, and preferably not less than 15 μm and not more than 100 μm.

The material for the write wiring trace W1 is not limited to copper. For example, another metal such as gold (Au) and aluminum or an alloy such as a copper alloy and an aluminum alloy may be used.

Then, the second insulating layer 42 made of polyimide, for example, is formed on the first insulating layer 41 to cover the write wiring trace W1 as shown in FIG. 3(c).

The thickness of the second insulating layer 42 is not less than 4 μm and not more than 26 μm, for example, and preferably not less than 8 μm and not more than 21 μm. Another insulating material such as epoxy resin instead of polyimide resin may be used as the second insulating layer 42.

The conductor layers W2a, R1a, R2a made of copper, for example, are subsequently formed on the second insulating layer 42 as shown in FIG. 3(d). The conductor layers W2a, R1a, R2a may be formed using the semi-additive method, or another method such as the subtractive method, for example.

The thickness of the conductor layer W2a is not less than 1 μm and not more than 15 μm, for example, and preferably not less than 3 μm and not more than 12 μm. The width of the conductor layer W2a is not less than 10 μm and not more than 500 μm, for example, and preferably not less than 15 μm and not more than 100 μm.

The thickness of each of the conductor layers R1a, R2a is not less than 1 μm and not more than 15 μm, for example, and preferably not less than 3 μm and not more than 12 μm. The width of each of the conductor layers R1a, R2a is not less than 10 μm and not more than 500 μm, for example, and preferably not less than 15 μm and not more than 100 μm.

The material for the conductor layers W2a, R1a, R2a is not limited to copper. For example, another metal such as gold (Au) and aluminum or an alloy such as a copper alloy and an aluminum alloy may be used.

Next, the reinforcing alloy layers W2b, W2c are sequentially formed to cover the conductor layer W2a, the reinforcing alloy layers R1b, R1c are sequentially formed to cover the conductor layer R1a, and the reinforcing alloy layers R2b, R2c are sequentially formed to cover the conductor layer R2a as shown in FIG. 4(a). Accordingly, the write trace W2 and the read wiring traces R1, R2 are formed.

The reinforcing alloy layers W2b, W2c, R1b, R1c, R2b, R2c may be formed by electrolytic plating, for example, or another method such as electroless plating or vapor deposition.

As described above, the reinforcing alloy layers W2b, W2c, R1b, R1c, R2b, R2c include copper and tin, for example. The reinforcing alloy layers W2b, R1b, R2b preferably include copper at a larger ratio than that of the reinforcing alloy layers W2c, R1c, R2c. In this case, the reinforcing alloy layers W2b, W2c, R1b, R1c, R2b, R2c can be formed on surfaces of the conductor layers W2a, R1a, R2a without generating internal stress to the conductor layers W2a, R1a, R2a.

In the reinforcing alloy layers W2b, R1b, R2b, a ratio of tin to copper is not less than 1/99 and not more than 47/53, for example. In the reinforcing alloy layers W2c, R1c, R2c, the ratio of tin to copper is not more than 47/53, for example. Note that a tin-copper alloy composed of copper and tin is expressed by a composition formula such as Cu41Sn11, Cu10Sn3, Cu11Sn9, Cu3Sn, Cu6Sn5, Cu39Sn11, and Cu81Sn22. In this case, $x/y \geq 1.11$ in the composition formulae $Cu_xSn_y$.

The thickness of each of the reinforcing alloy layers W2b, R1b, R2b is not less than 0.001 μm and not more than 1.5 μm, and preferably not less than 0.2 μm and not more than 0.8 μm. The thickness of each of the reinforcing alloy layers W2c, R1c, R2c is not less than 0.001 μm and not more than 1.5 μm, and preferably not less than 0.2 μm and not more than 0.8 μm.

A distance between the read wiring traces R1, R2 is not less than 10 μm and not more than 100 μm, for example, and preferably not less than 30 μm and not more than 80 μm. In this case, a larger space for arranging the read wiring traces R1, R2 can be avoided and the read wiring traces R1, R2 can be prevented from being subjected to the proximity effect. Accordingly, the transmission loss in the read wiring traces R1, R2 can be reduced.

Note that silver, for example, instead of the alloy composed of copper and tin may be used as the material for the reinforcing alloy layers W2b, R1b, R2b. Similarly, silver, for example, instead of the alloy composed of copper and tin may be used as the material for the reinforcing alloy layers W2c, R1c, R2c.

The ratio of copper and tin of the reinforcing alloy layers W2b, R1b, R2b may be equal to the ratio of copper and tin of the reinforcing alloy layers W2c, R1c, R2c if the strength of the write wiring trace W2 and the read wiring traces R1, R2 can be sufficiently improved.

Then, the third insulating layer 43 made of polyimide, for example, is formed on the second insulating layer 42 to cover the reinforcing alloy layers W2c, R1c, R2c as shown in FIG. 4(b).

The thickness of the third insulating layer 43 is not less than 1 μm and not more than 30 μm, for example, and preferably not less than 2 μm and not more than 20 μm. Another insulating material such as epoxy resin instead of polyimide resin may be used as the third insulating layer 43.

(3) Effects

When the currents pass through the write wiring traces W1, W2 in directions opposite to each other, the currents are concentrated along the surfaces of the write wiring traces W1, W2 that are opposite to each other due to the proximity effect. Here, if the write wiring traces W1, W2 are arranged in the common plane, the currents intensively pass along side surfaces of the write wiring traces W1, W2 that are opposite to each other.

In the suspension board 1 according to the present embodiment, the write wiring trace W2 is arranged above the write wiring trace W1. In this case, the currents intensively pass along the upper surface of the write wiring trace W1 and the lower surface of the write wiring trace W2. In the write wiring traces W1, W2, the area of each of the upper surface and the lower surface is larger than the area of the side surface. Accordingly, the transmission loss in the write wiring traces W1, W2 is reduced as compared with a case where the write wiring traces W1, W2 are arranged in the common plane. Accordingly, the transmission characteristics of the write wiring traces W1, W2 are improved.

While the second and third insulating layers 42, 43 are formed above the write wiring trace W1, only the third insulating layer 43 is formed above the write wiring trace W2. Thus, an external stress is more liable to be applied to the write wiring trace W2 than to the write wiring trace W1.

Therefore, the write wiring trace W2 that is arranged above out of the write wiring traces W1, W2 includes the conductor layer W2a and the reinforcing alloy layers W2b, W2c in the present preferred embodiment. The reinforcing alloy layers W2b, W2c are formed to cover the upper surface and the side surfaces of the conductor layer W2a. This effectively prevents the write wiring trace W2 from being damaged.

In this case, the reinforcing alloy layer having higher resistivity than copper is not provided on the upper surface of the write wiring trace W1 and the lower surface of the write wiring trace W2. Therefore, the transmission loss in the write wiring traces W1, W2 is not increased even though the currents intensively pass along the upper surface of the write wiring trace W1 and the lower surface of the write wiring trace W2. As a result, the transmission characteristics of the write wiring traces W1, W2 can be well maintained and the strength of the write wiring trace W2 can be improved.

Meanwhile, the read wiring traces R1, R2 need to have high impedance for reading information from the magnetic disk. Therefore, the read wiring traces R1, R2 are formed in the common plane in the present embodiment. In this case, the higher impedance of the read wiring traces R1, R2 can be maintained as compared with a case where the read wiring traces R1, R2 are arranged one above the other.

The read wiring traces R1, R2 include the reinforcing alloy layers R1b, R1c, R2b, R2c, respectively, so that the strength of the read wiring traces R1, R2 are improved. This prevents the read wiring traces R1, R2 from being damaged.

Figure 5:
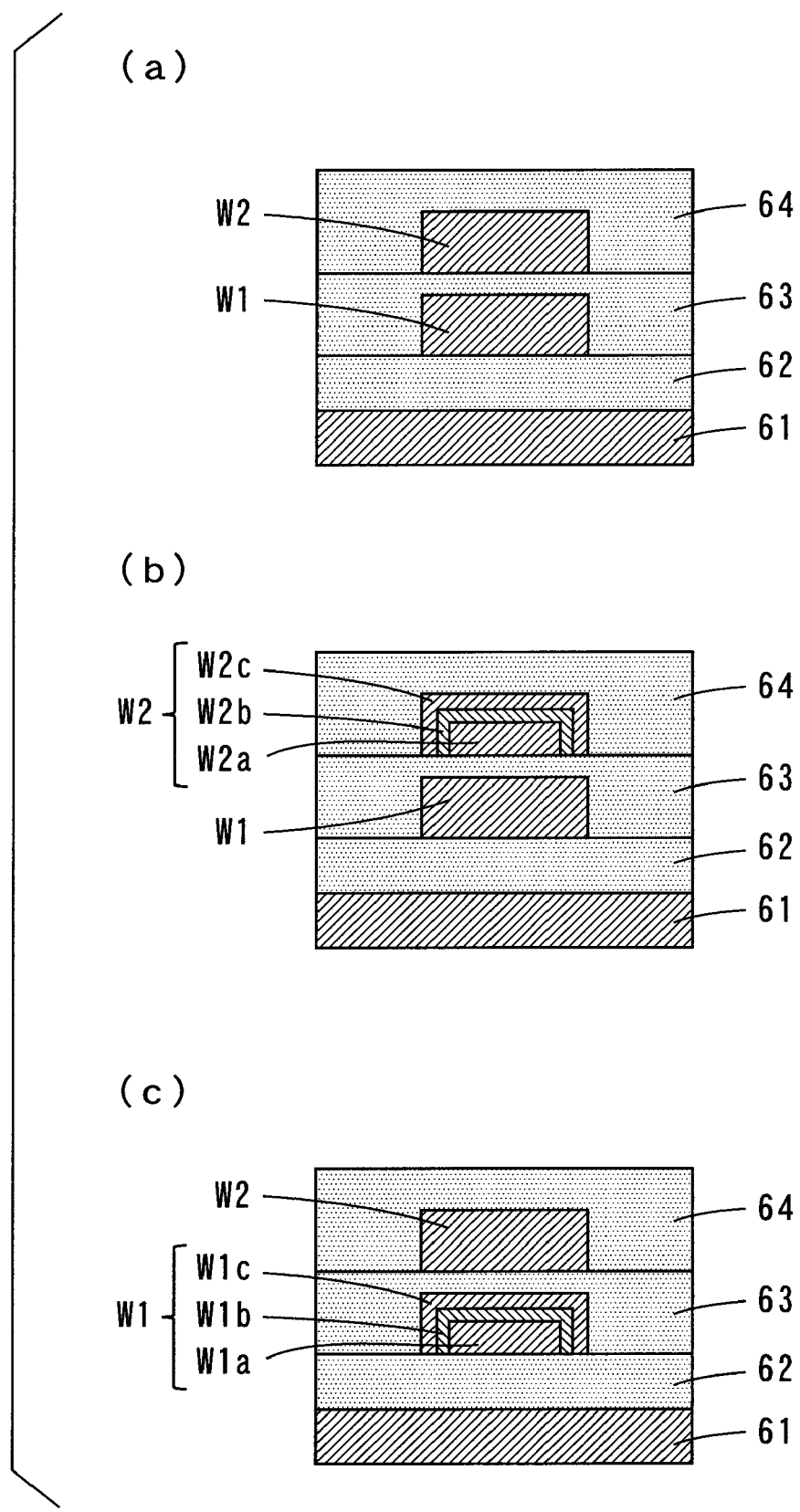
FIG. 5 is a sectional view for explaining examples of the configuration of write wiring traces.

(4) Measurement of the Transmission Loss (4-1) Transmission Loss in the Write Wiring Traces The write wiring traces W1, W2 of various configurations were manufactured, and differences in the transmission loss were examined. FIG. 5 is a sectional view for explaining examples of the configuration of the write wiring traces W1, W2. Note that the example of FIG. 5(b) corresponds to an inventive example of the present invention, and the examples of FIGS. 5(a) and (c) correspond to comparative examples.

In the example of FIG. 5(a), an insulating layer 62 made of polyimide was formed on a metal substrate 61 made of stainless steel. The thickness of the insulating layer 62 was 5 μm. Then, the write wiring trace W1 made of copper was formed on the insulating layer 62. The thickness of the write wiring trace W1 was 4 μm. An insulating layer 63 made of polyimide was subsequently formed on the insulating layer 62 to cover the write wiring trace W1. The thickness of a portion of the insulating layer 63 above the write wiring trace W1 was 5 μm.

Next, the write wiring trace W2 made of copper was formed on the insulating layer 63. The thickness of the write wiring trace W2 was 7 μm. An insulating layer 64 made of polyimide was then formed on the insulating layer 63 to cover the write wiring trace W2. The thickness of a portion of the insulating layer 64 above the write wiring trace W2 was 4 μm.

The example of FIG. 5(b) is different from the example of FIG. 5(a) in the following points. In the example of FIG. 5(b), the write wiring trace W2 included the conductor layer W2a and the reinforcing alloy layers W2b, W2c. The conductor layer W2a made of copper was formed on the insulating layer 63, and then the reinforcing alloy layer W2b including copper and tin at a ratio of 99:1 and the reinforcing alloy layer W2c including copper and tin at a ratio of 41:11 were sequentially formed to cover the upper surface and the side surfaces of the conductor layer W2a. Note that the thickness of the conductor layer W2a was 4.9 μm, the thickness of the reinforcing alloy layer W2b was 1.5 μm, and the thickness of the reinforcing alloy layer W2c was 0.6 μm. Then, the insulating layer 64 was formed to cover the write wiring trace W2.

The example of FIG. 5(c) is different from the example of FIG. 5(a) in the following points. In the example of FIG. 5(c), the write wiring trace W1 included a conductor layer W1a and reinforcing alloy layers W1b, W1c. The conductor layer W1a made of copper was formed on the insulating layer 62, and then the reinforcing alloy layer W1b including copper and tin at the ratio of 99:1 and the reinforcing alloy layer W1c including copper and tin the ratio of 41:11 were sequentially formed to cover the upper surface and the side surfaces of the conductor layer W1a. Note that the thickness of the conductor layer W1a was 1.9 μm, the thickness of the reinforcing alloy layer W1b was 1.5 μm, and the thickness of the reinforcing alloy layer W1c was 0.6 μm. Then, the insulating layer 63 was formed to cover the write wiring trace W1.

In the write wiring traces W1, W2 of FIG. 5(a) to (c), gains in a differential mode input and a differential mode output (Sdd21) were examined. Note that a negative gain represents a loss.

Figure 6:
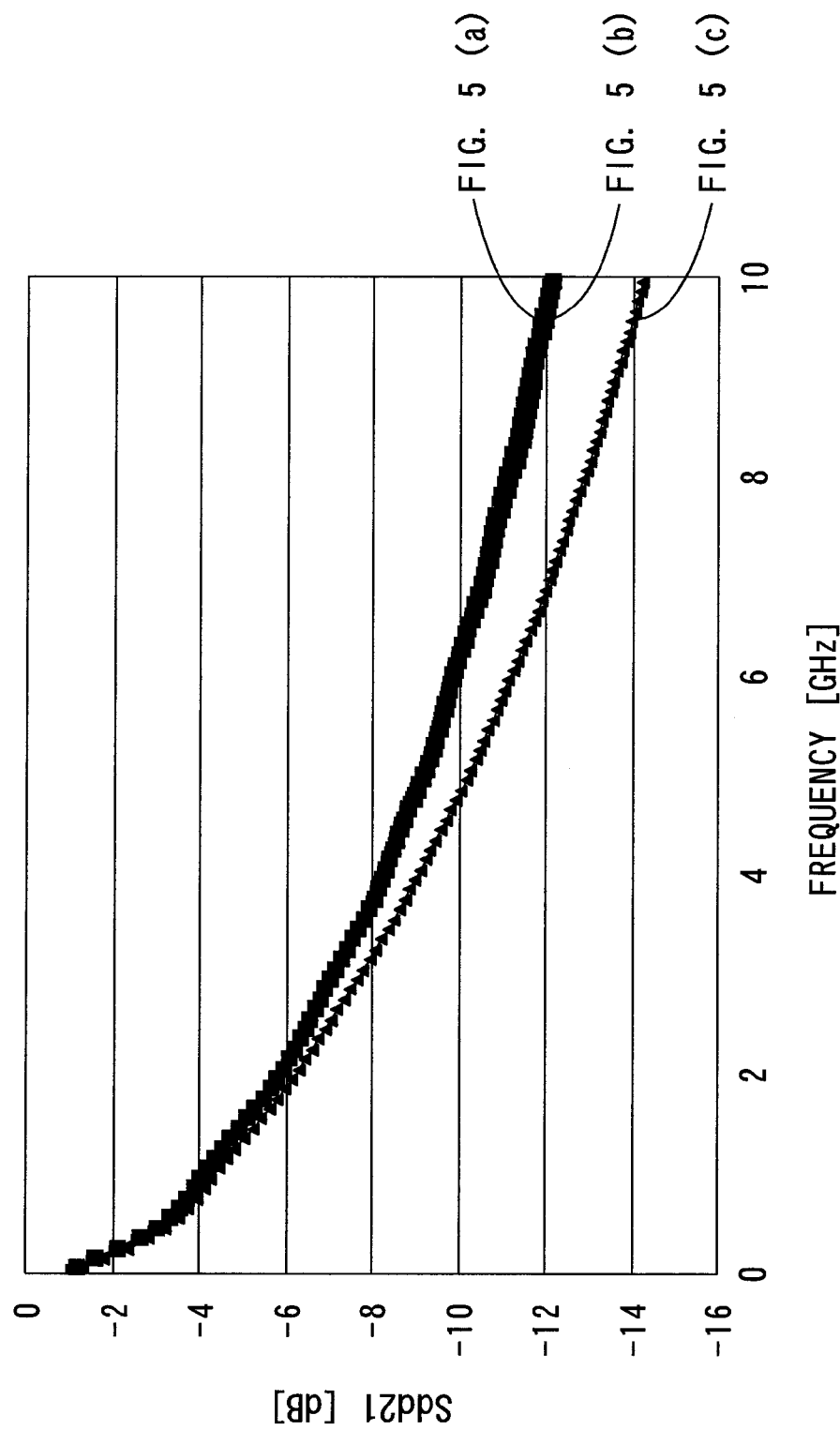
FIG. 6 is a diagram showing results of simulation of gains in a differential mode input and a differential mode output.

FIG. 6 shows results of simulation of the gains in the differential mode input and the differential mode output. In FIG. 6, the ordinate represents the gain, and the abscissa represents a frequency of a signal. As shown in FIG. 6, the loss in the write wiring traces W1, W2 of FIGS. 5(a) and (b) was smaller than the loss in the write wiring traces W1, W2 of FIG. 5(c).

The results show that when the write wiring trace W2 that is positioned above has the reinforcing alloy layers W2b, W2c, the resulting transmission characteristics were equivalent to transmission characteristics of the write wiring traces W1, W2 not having the reinforcing alloy layers.

Meanwhile, it was found that when the write wiring trace W1 positioned below has the reinforcing alloy layers W1b, W1c, the resulting transmission loss was larger than the transmission loss of the write wiring traces W1, W2 not having the reinforcing alloy layers.

Accordingly, it was found that the write wiring trace W2 has the reinforcing alloy layers W2b, W2c, thereby maintaining the transmission characteristics of the write wiring traces W1, W2 well and preventing the write wiring trace W2 from being damaged.

(4-2) Transmission Loss in the Read Wiring Traces

Figure 7:
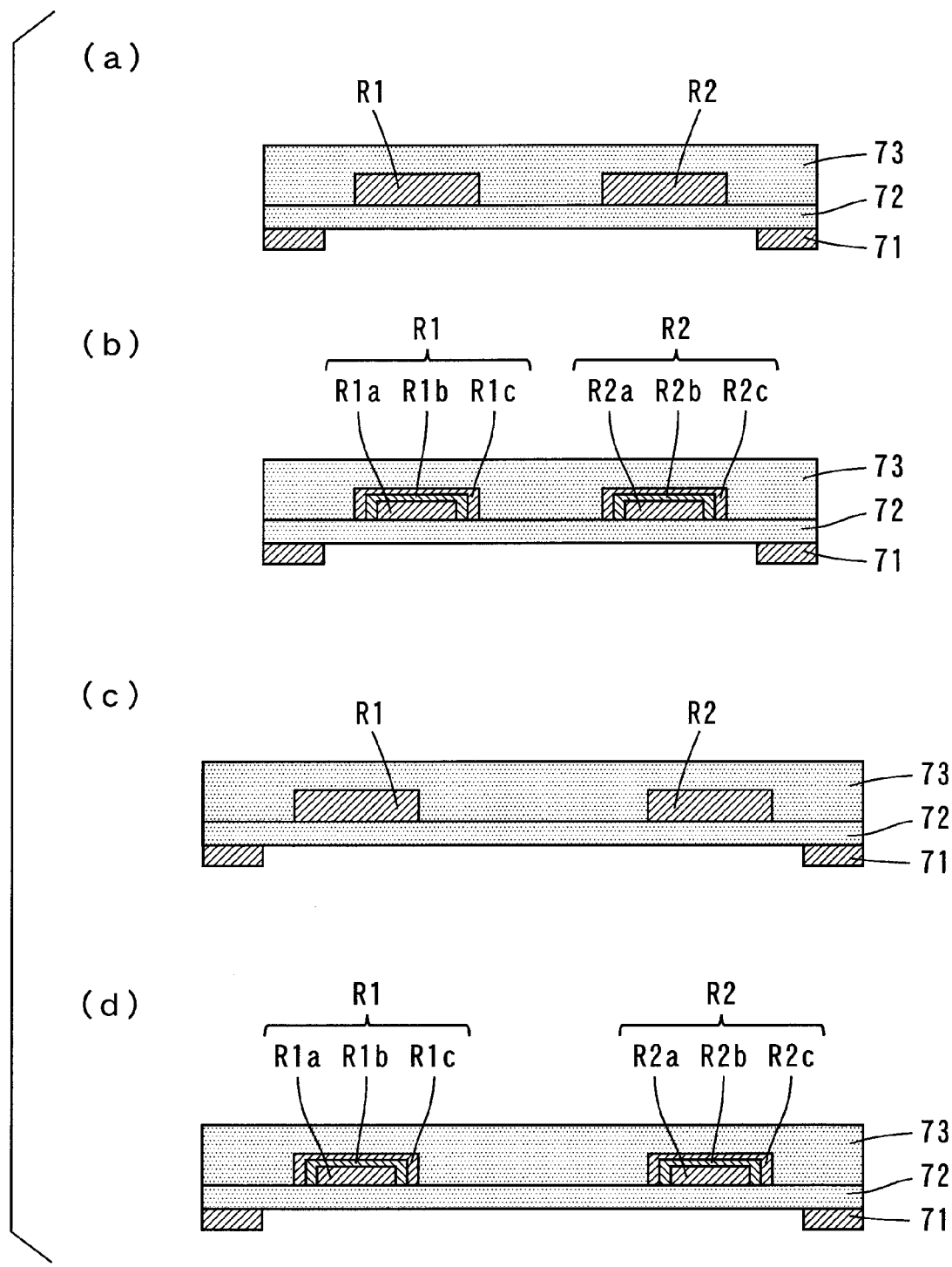
FIG. 7 is a sectional view for explaining examples of the configuration of read wiring traces.

The read wiring traces R1, R2 of various configurations were manufactured and differences in the transmission loss were examined. FIG. 7 is a sectional view for explaining examples of the configuration of the read wiring traces R1, R2.

In the example of FIG. 7(a), an insulating layer 72 made of polyimide was formed on a metal substrate 71 made of stainless steel. The thickness of the insulating layer 72 was 10 μm. The read wiring traces R1, R2 made of copper were formed at a distance of 15 μm from each other on the insulating layer 72. The thickness of each of the read wiring traces R1, R2 was 12 μm, and the width of each of the read wiring traces R1, R2 was 80 μm. An insulating layer 73 made of polyimide was subsequently formed on the insulating layer 72 to cover the read wiring traces R1, R2. The thickness of each portion of the insulating layer 73 above the read wiring traces R1, R2 was 5 μm.

The example of FIG. 7(b) is different from the example of FIG. 7(a) in the following points. In the example of FIG. 7(b), the read wiring trace R1 included the conductor layer R1a and the reinforcing alloy layers R1b, R1c. The conductor layer R1a made of copper was formed on the insulating layer 72, and then the reinforcing alloy layer R1b including copper and tin at the ratio of 99:1 and the reinforcing alloy layer R1c including copper and tin at the ratio of 41:11 were sequentially formed to cover the upper surface and the side surfaces of the conductor layer R1a. Note that the thickness of the conductor layer R1a was 9.9 μm, the thickness of the reinforcing alloy layer R1b was 1.5 μm, and the thickness of the reinforcing alloy layer R1c was 0.6 μm.

In addition, the read wiring trace R2 included the conductor layer R2a and the reinforcing alloy layers R2b, R2c. The conductor layer R2a made of copper was formed on the insulating layer 72, and then the reinforcing alloy layer R2b including copper and tin at the ratio of 99:1 and the reinforcing alloy layer R2c including copper and tin at the ratio of 41:11 were sequentially formed to cover the upper surface and the side surfaces of the conductor layer R2a. Note that the thickness of the conductor layer R2a was 9.9 μm, the thickness of the reinforcing alloy layer R2b was 1.5 μm, and the thickness of the reinforcing alloy layer R2c was 0.6 μm. Then, the insulating layer 73 was formed to cover the read wiring traces R1, R2.

The example of FIG. 7(c) has the same configuration as the example of FIG. 7(a) excluding that the distance between the read wiring traces R1, R2 was 50 μm.

The example of FIG. 7(d) has the same configuration as the example of FIG. 7(b) excluding that the distance between the read wiring traces R1, R2 was 50 μm.

In the read wiring traces R1, R2 of FIGS. 7(a) to (d), gains in the differential mode input and the differential mode output (Sdd21) were examined. Note that a negative gain represents a loss.

Figure 8:
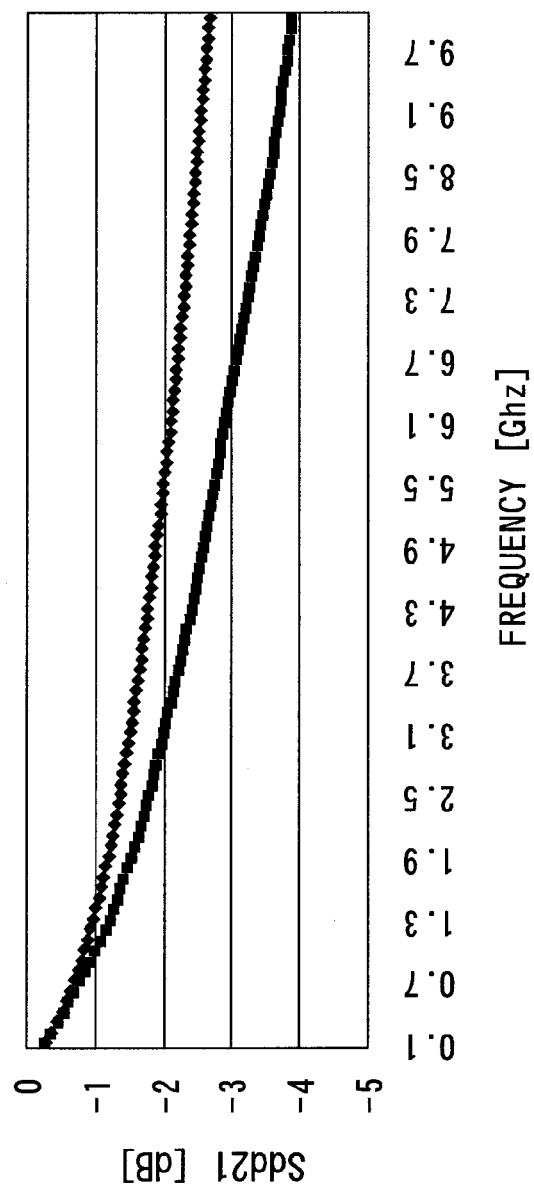
FIG. 8 is a diagram showing results of simulation of gains in the differential mode input and the differential mode output.
Figure 9:
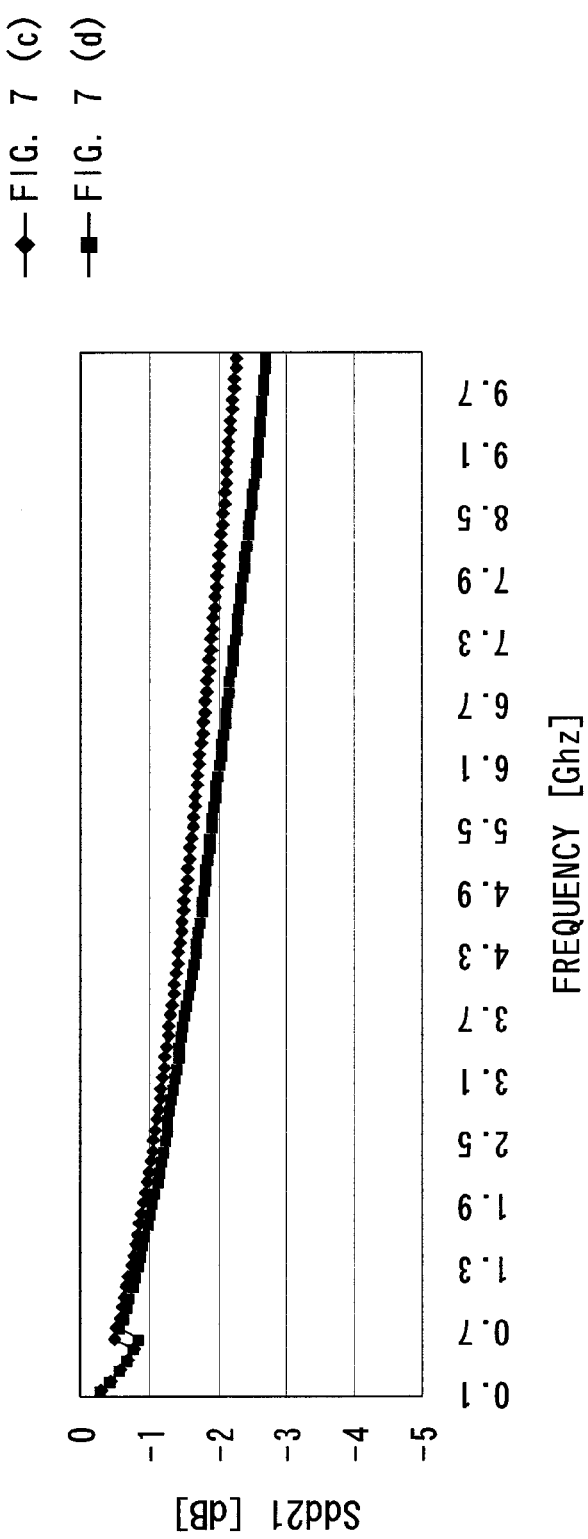
FIG. 9 is a diagram showing results of simulation of gains in the differential mode input and the differential mode output.
Figure 10:
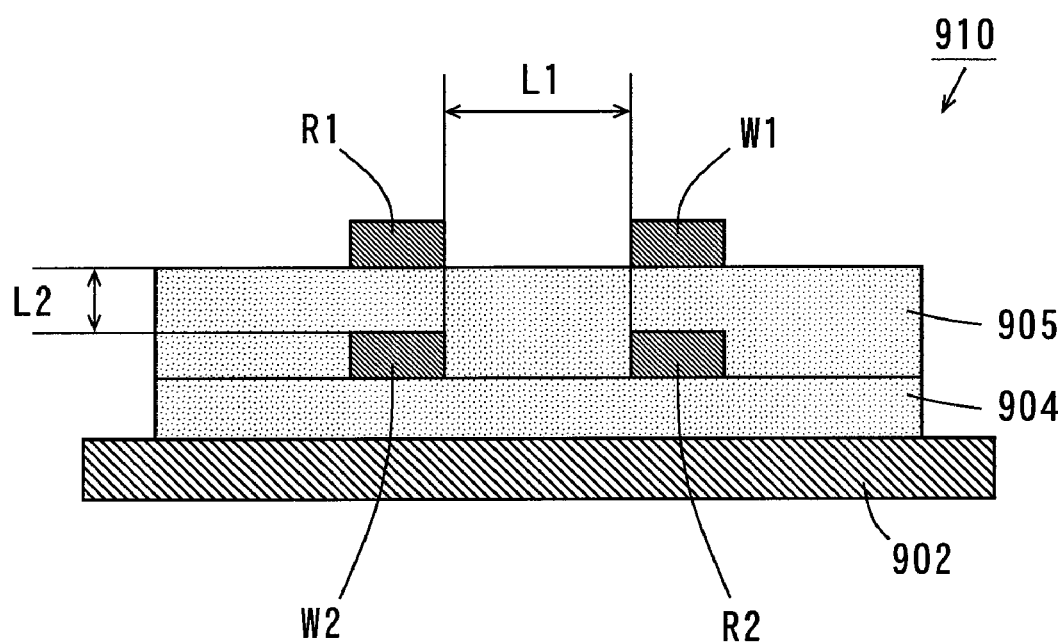
FIG. 10 is a vertical sectional view of a conventional suspension board.

FIGS. 8 and 9 show results of simulation of the gains in the differential mode input and the differential mode output. FIG. 8 shows results of simulation in the examples of FIGS. 7(a) and (b), and FIG. 9 shows results of simulation in the examples of FIGS. 7(c) and (d). Note that in FIGS. 8 and 9, the ordinate represents the gain, and the abscissa represents a frequency of a signal.

As shown in FIG. 8, the loss in the read wiring traces R1, R2 of FIG. 7(b) was larger than the loss in the read wiring traces R1, R2 of FIG. 7(a). Meanwhile, the loss in the read wiring traces R1, R2 of FIG. 7(d) was almost the same as the loss in the read wiring traces R1, R2 of FIG. 7(c) as shown in FIG. 9.

In addition, the loss in the read wiring traces R1, R2 of FIG. 7(c) was smaller than the loss in the read wiring traces R1, R2 of FIG. 7(a), and the loss in the read wiring traces R1, R2 of FIG. 7 (d) was smaller than the loss in the read wiring traces R1, R2 of FIG. 7(b) as shown in FIGS. 8 and 9.

The results of these show that when the read wiring traces R1, R2 have the reinforcing alloy layers R1b, R1c, R2b, R2c, the distance of 50 μm between the read wiring traces R1, R2 provides better transmission characteristics than those in the case of the distance of 15 μm between the read wiring traces R1, R2.

Thus, it was found that the read wiring traces R1, R2 have the reinforcing alloy layers R1b, R1c, R2b, R2c and the distance between the read wiring traces R1, R2 is not less than 30 μm and not more than 80 μm, so that the transmission characteristics of the read wiring traces R1, R2 can be well maintained and the read wiring traces R1, R2 can be prevented from being damaged.

(5) Other Embodiments

While the read wiring traces R1 R2 are formed on the second insulating layer 42 in the foregoing embodiment, the read wiring traces R1, R2 may be formed on the first insulating layer 41. Moreover, the read wring traces R1, R2 may be formed to have a height that is different from that of any of the write wiring traces W1, W2.

While the reinforcing alloy layers W2b, W2c are formed to cover the upper surface and the side surfaces of the conductor layer W2a of the write wiring trace W2 in the foregoing embodiment, similar reinforcing alloy layers may be formed in another region that excludes a region on the upper surface side of the write wiring trace W1 and a region on the lower surface side of the conductor layer W2a and includes at least a region on the upper surface of the conductor layer W2a of the write wiring trace W2.

While the reinforcing alloy layers R1b, R1c, R2b, R2c are formed to cover the upper surface and the side surfaces of the conductor layers R1a, R2a of the read wiring traces R1, R2 in the foregoing embodiment, similar reinforcing alloy layers may be formed on any region of the conductor layers R1a, R2a.

(6) Correspondences between Elements in the Claims and Parts in Embodiments

In the following paragraph, non-limiting examples of correspondences between various elements recited in the claims below and those described above with respect to various preferred embodiments of the present invention are explained.

In the foregoing embodiments, the write wiring trace W1 is an example of a first wiring layer, the conductor layer W2a is an example of a second wiring layer, the conductor layer R1a is an example of a third wiring layer, the conductor layer R2a is an example of a fourth wiring layer, the reinforcing alloy layers W1b, W1c are examples of a first reinforcing layer, the reinforcing alloy layers R1b, R1c are examples of a second reinforcing layer, the reinforcing alloy layers R2b, R2c are examples of a third reinforcing layer, the suspension body 10 is an example of a metal substrate, and the tongue 12 is an example of a head.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board comprising:
   a first insulating layer;
   a first wiring layer that is formed on said first insulating layer;
   a second insulating layer that is formed on said first insulating layer to cover said first wiring layer;
   a second wiring layer that is formed on said second insulating layer to be positioned above said first wiring layer and constitutes with said first wiring layer a signal line pair; and
   a conductive first reinforcing layer that is formed on at least an upper surface of said second wiring layer and not formed on an upper surface of said first wiring layer and a lower surface of said second wiring layer, wherein
   a width of said first wiring layer is larger than a thickness of said first wiring layer, and a width of said second wiring layer is larger than a thickness of said second wiring layer.

2. The printed circuit board according to claim 1, wherein said first reinforcing layer has higher rigidity and higher resistivity than rigidity and resistivity of said second wiring layer.

3. The printed circuit board according to claim 2, wherein said first and second wiring layers include copper, and said first reinforcing layer includes an alloy of copper and tin.

4. The printed circuit board according to claim 1, further comprising third and fourth wiring layers that are formed at a distance on said first insulating layer or said second insulating layer and constitute a signal line pair.

5. The printed circuit board according to claim 4, further comprising:
   a conductive second reinforcing layer that is formed on at least one surface of said third wiring layer, and
   a conductive third reinforcing layer that is formed on at least one surface of said fourth wiring layer.

6. The printed circuit board according to claim 5, wherein said second and third reinforcing layers have higher rigidity than rigidity of said third and fourth wiring layers.

7. The printed circuit board according to claim 4, wherein the distance between said third and fourth wiring layers is not less than 10 μm and not more than 100 μm.

8. The printed circuit board according to claim 4, further comprising:
   a long-sized metal substrate; and
   a head provided on said metal substrate for reading and writing signals, wherein said first insulating layer is formed on said metal substrate,
   said first, second, third and fourth wiring layers are electrically connected to said head, and
   currents pass through the first and second wiring layers at the time of writing the signals by said head, and currents pass through the third and fourth wiring layers at the time of reading the signals by said head.

9. A method of manufacturing a printed circuit board comprising the steps of:
   forming a first wiring layer on a first insulating layer;

forming a second insulating layer on said first insulating layer to cover said first wiring layer;

forming a second wiring layer, which constitutes with said first wiring layer a signal line pair, on said second insulating layer to be positioned above said first wiring layer; and forming a conductive first reinforcing layer on at least an upper surface of said second wiring layer and not forming the conductive first reinforcing layer on an upper surface of said first wiring layer and a lower surface of said second wiring layer, wherein a width of said first wiring layer is larger than a thickness of said first wiring layer, and a width of said second wiring layer is larger than a thickness of said second wiring layer.

* * * * *

UNITED STATES PATENT AND TRADEMARK OFFICE
CERTIFICATE OF CORRECTION

PATENT NO.       : 8,367,937 B2                                        Page 1 of 1
APPLICATION NO.  : 12/549993
DATED            : February 5, 2013
INVENTOR(S)      : Voonyee Ho et al.

It is certified that error appears in the above-identified patent and that said Letters Patent is hereby corrected as shown below:

Title page, Section (56) OTHER PUBLICATIONS:

"Office Action issued Feb. 21, 2012 in CN Application No. 2008-226393"

should read

"Office Action issued Feb. 21, 2012 in JP Application No. 2008-226393".

Signed and Sealed this
Fourteenth Day of May, 2013

Teresa Stanek Rea
*Acting Director of the United States Patent and Trademark Office*